United States Patent [19]
Sato

[11] 4,111,698
[45] Sep. 5, 1978

[54] SPIN-COATED PHOTOSENSITIVE SILVER HALIDE PHOTOMASK

[75] Inventor: Masamichi Sato, Saitama, Japan

[73] Assignee: Fuji Photo Film Co., Ltd., Minami Ashigara, Japan

[21] Appl. No.: 710,049

[22] Filed: Jul. 30, 1976

[30] Foreign Application Priority Data

Jul. 30, 1975 [JP] Japan .................................. 50-92841

[51] Int. Cl.² ............................................. G03C 1/72
[52] U.S. Cl. ......................................... 96/79; 96/67; 427/240
[58] Field of Search ................. 427/240; 96/86 R, 67, 96/79

[56] References Cited

U.S. PATENT DOCUMENTS

| 1,906,199 | 4/1933 | Rado .................... 96/86 R |
| 3,314,816 | 4/1967 | Tobex .................... 427/240 |
| 3,911,169 | 10/1975 | Lesaicherre et al. ................. 427/240 |

OTHER PUBLICATIONS

Reed et al., "Spin Coating Photoresist" IBM Tech. Disc. Bull., vol. 16, #5 (10/1973), pp. 1535–1536.

Primary Examiner—John D. Welsh
Attorney, Agent, or Firm—Sughrue, Rothwell, Mion, Zinn and Macpeak

[57] ABSTRACT

A support suitable for spin coating which is transparent to near ultraviolet and visible light and has a flat surface to be coated, wherein the periphery of the surface is removed in an amount of at least the excess thickness at the periphery of a coated layer to be formed by spin coating so that the surface of the coated layer at the periphery is not raised as compared to the surface of the coated layer at the center. A mask blank which has a mask layer formed on the support is also disclosed as is a light-sensitive photographic material which has a silver halide emulsion layer formed on the support or the mask blank. The process is also claimed.

9 Claims, 11 Drawing Figures

SPIN-COATED PHOTOSENSITIVE SILVER HALIDE PHOTOMASK

BACKGROUND OF THE INVENTION

1. Field of the Invention

The present invention relates to a support, a photomask blank and a light-sensitive photomask material. More particularly, it relates to a support suitable for spin coating, a light-sensitive photographic material which comprises a silver halide photographic emulsion layer formed on the support, a mask blank which comprises a mask layer formed on the support and a light-sensitive photomask material which comprises a silver halide photographic emulsion layer formed on the mask blank. A process of forming spin coated layers is also disclosed.

2. Descripion of the Prior Art

It is well known in the field of semiconductor device fabrication to coat a photoresist using an organic solvent as a coating solvent on a support by spin coating. For example, a support (e.g., a glass plate having a thin metal layer thereon, a silicon wafer, etc.) to be coated is placed on the turntable of a spinner and a photoresist coating solution is dropped thereon, and then the turntable is spun at a high speed (usually 2,000 to 6,000 r.p.m. ) to obtain a photoresist coating layer having a uniform thickness.

However, when a gelatin silver halide emulsion is coated on a support by spin coating, it has been found that the following problems arise.

The amount of binder (mainly gelatin) of a gelatin silver halide emulsion coating solution is usually much smaller than the solid content of a photoresist coating solution, therefore, the thickness of the silver halide emulsion layer after drying is much smaller than the thickness of the silver halide emulsion layer immediately after coating. Usually, it is decreased to about 1/50 its original value. Therefore, the thickness of the gelatin silver halide emulsion layer becomes extremely small (a fraction of a micron) if the spin coating is carried out at a high spinning speed as is in the spin coating of a photoresist.

Further, a gelatin silver halide emulsion gels at around room temperature, and if the spinning speed is high, the emulsion gels during spinning since the emulsion is chilled by the air stream generated by spinning.

Occasionally, the coated layer at the periphery is spattered since a high centrifugal force acts on the coated layer at the periphery. There is no problem if the coated layer at the periphery is spattered to uncover the surface of the support at the periphery completely and at a uniform width; however, the position and the size of the coated layer spattered are not uniform, and the emulsion remains on the uncovered surface of the support in a dappled fashion.

On the other hand, if the spinning speed is decreased (to 100 to 200 r.p.m.) to remove the above described defects, the following problems arise. First, when the spinning speed is decreased, the centrifugal force acting on the coated layer at the periphery of the support is small, and the coating solution collects on the periphery and side edges (particularly on corners when the support is square or rectangular) of the support, whereby the thickness of the coated layer at these portions becomes particularly large. This effect is particularly large as compared with photoresists, since the wettability of a gelatin silver halide emulsion coating solution to a support is poorer than that of a photoresist coating solution. The wettability of a gelatin silver halide emulsion to a support can be improved by adding a surface active agent thereinto, but is still insufficient. In addition, a large amount of surface active agent cannot be added, since the adhesion of the emulsion layer to the support becomes poor and other photographic properties are degraded. It may be considered that the thickness of the coated layer at the periphery becomes large as described above because the wettability of the emulsion to the support is poor and the viscosity of the emulsion becomes extremely high due to the temperature decrease during spinning.

It is not desirable that the thickness of the coated layer be large at the periphery of the support, since a non-uniform gap is formed between the photomask and the coated layer when a photomask, for example, is superimposed on the coated layer and exposed to light.

SUMMARY OF THE INVENTION

It is, therefore, one object of the present invention to provide a support which can provide the surface of a coated layer at the periphery of the support which is not raised as compared to the surface of a coated layer at the center of the support when a silver halide emulsion is coated on a flat support by spin coating.

Another object of the present invention is to provide a support having thereon a mask layer and having the above described capability. A still another object of the present invention is to provide a light-sensitive photographic material using the above described support and a light-sensitive photomask material using the above described support having a mask layer thereon.

Yet another object of the present invention is to provide a spin coating process.

The objects of the present invention can be attained with a support transparent to near ultraviolet and visible light (near ultraviolet light has a wavelength range of from about 2,900 Å to about 4,000 Å, whereas visible light has a wavelength of from about 4,000 Å to about 7,000 Å) and having a flat surface to be coated, wherein the periphery of the surface is removed in an amount of at least the excess thickness of a coated layer at the periphery to be formed by spin coating.

Also, the objects of the present invention can be attained with a light-sensitive photographic material which comprises a silver halide photographic emulsion layer on the above described support.

Further, the objects of the present invention can be attained with a mask blank which comprises a mask layer on the above described support.

Further, the objects of the present invention can be attained with a light-sensitive photomask material which comprises a silver halide photographic emulsion layer on the above described mask blank.

BRIEF DESCRIPTION OF THE ACCOMPANYING DRAWINGS

FIG. 3 (*b*) illustrates an enlarged sectional view of the periphery of a light-sensitive photographic material obtained by spin coating a silver halide emulsion on the support of FIG. 3 (a).

DETAILED DESCRIPTION OF THE INVENTION

Figure 1:
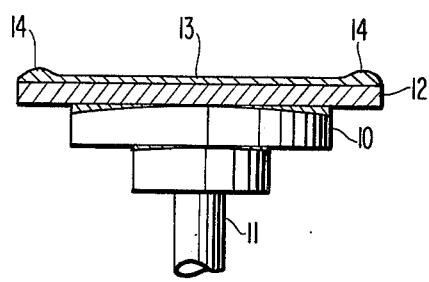
FIG. 1 illustrates a spin coating method in general.

In the following the present invention will be described in detail by referring to the drawings.

FIG. 1 illustrates a spin coating method in general. In FIG. 1, numeral 10 designates a turntable rotatable with a shaft 11 and having mounted thereon a support 12 to be coated. The support 12 can be mounted by placing the same on the turntable as shown in FIG. 1, or can be mounted by hooking the side edges of the support without placing it on the turntable. Such procedures are known in the art. Numeral 13 designates a coated layer and 14 the thickly coated layer at the periphery.

Figure 2:
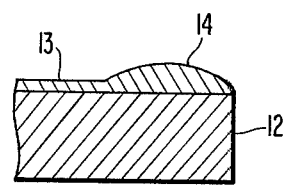
FIG. 2 illustrates an enlarged sectional view of the periphery of the coated layer when a silver halide emulsion is coated on a conventional support by spin coating.

FIG. 2 illustrates an enlarged sectional view of the periphery of the photographic material obtained by the method shown in FIG. 1. The thickness of the periphery 14 of the coated layer 13 is usually about 2 to about 10 times that of the uniform coated layer at the center portion, and the width of the periphery 14 is usually about 2 to about 6 mm. It should be noted that there is no relationship between the width of the periphery and the total area of the support, the width of the periphery depending substantially on the nature of the solution to be coated, the wettability of the support, the spin coating rate, the viscosity of the solution, the shape of the edge of the support, etc. While no image is usually formed in this area, the thickly coated layer 14 at the periphery is not desirable since a non-uniform gap is formed between the emulsion layer and an original when image-wise exposure is applied on the emulsion layer by contact exposure.

While not to be construed as unduly limitative, typically spin coating rates in accordance with the present invention will vary from about 50 to about 3,000 r.p.m. for good results, even more preferably from about 100 to about 2,000 r.p.m.

These conditions are excellent to obtain an emulsion layer having a thickness of from about 0.1 to about 10 μm on a support having a thickness of from about 0.1 to about 10 mm and can also be utilized in combination with a masking layer as later defined.

Preferred results in accordance with the present invention are obtained utilizing supports having a degree of flatness of 0 to about 20 μm, even more preferably 0 to 10 μm, that is, wherein any irregularity on the support surface is equal to or less than the maximum value set forth above.

Figure 3A:
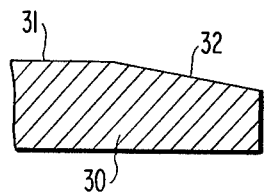
FIG. 3 (*a*) illustrates an enlarged sectional view of the periphery of the support of one embodiment of the present invention.
Figure 3B:
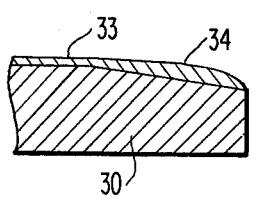

FIGS. 3 (a) and 3 (b) illustrate enlarged sectional view of the periphery of one embodiment of the support of the present invention and a photographic material obtained by coating a silver halide emulsion layer on a support by a spin coating method, respectively. Any emulsion can be used for the present invention. However, a so-called Lippmann emulsion is particularly suitable for producing photomasks for microelectronic fabrication and a lithographic type emulsion is particularly suitable for producing photomasks for photo-fabrication. A Lippmann emulsion conventionally contains about 90 mol% or more silver bromide (preferably containing not more than about 5 mol% silver iodide) and contains silver halide grains of a mean grain size of not more than about 0.1 μ, in which the weight ratio of the silver halide to the water soluble binder is about 1:4 to about 6:1. Examples of lithographic type emulsions include those which contain about 50 mol% or more (preferably about 70 mol% or more) silver chloride and contain silver halide grains of a mean grain size of not more than about 1.0 μm.

In FIG. 3 (a), numeral 31 designates a flat area which occupies the major portion of the support 30, and numeral 32 designates a tapered portion at the periphery. In FIG. 3 (b), numerals 33 and 34 designate emulsion layers applied on areas 31 and 32 of the support, respectively. It is in the scope of the present invention to form the tapered area 32 so that any portion of the surface of the emulsion layer 34 does not exceed the surface of the emulsion layer 33. The angle between the plane 31 and plane 32 is preferably 1° to 30°; however, a larger angle can be employed. However, an angle larger than 60° is not desirable since a thickly coated layer is formed at the periphery of area 31. If the angle is smaller than 1°, the thickness of the coated layer at the periphery of the support becomes larger than the thickness of what is removed in tapered fashion when the width of the peripheral area 32 is small (e.g., about 2 mm). As a result, the surface of the coated layer at the periphery exceeds the surface of the coated layer at the center portion. When the width of the peripheral portion is extremely large, this angle can be smaller than 1°, however, in general, an angle of 1° to 30° is suitable.

Figure 4:
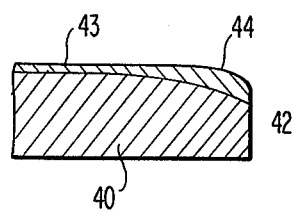
FIG. 4 illustrates an enlarged sectional view of a light-sensitive photographic material obtained by spin coating a silver halide emulsion on the support of another embodiment of the present invention.

FIG. 4 illustrates an enlarged sectional view of the periphery of a photographic material obtained by spin coating a silver halide emulsion on another embodiment of the support of the present invention. The support 40 consists of flat area 42 occupying the major portion of the support and area 42, a portion in which the thickness of the support becomes thinner toward the edge of the support along a smooth curved plane. It should be noted that, in this regard, that there is no importance to the rate of curvature or the dimensions of the curve. Numeral 43 designates an emulsion layer on area 41 and numeral 44 an emulsion layer on area 42. In this case, the curved surface 42 is also formed so that the surface of the emulsion layer 44 does not exceed the surface of the emulsion layer 43.

Figure 5:
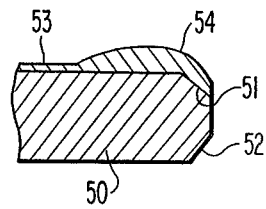
FIG. 5 illustrates an enlarged sectional view of the periphery of a light-sensitive photographic material obtained by spin coating a silver halide emulsion on a conventional support having chamfered edges (or beveled edges).

FIG. 5 illustrates an enlarged sectional view of the periphery of a photographic material obtained by spin coating a silver halide emulsion on a conventional support (e.g. a glass plate for hard surface masks for IC (Integrated Circuit) fabrication) having edges treated by a so-called chamfering or beveling. The upper edge 51 and lower edge 52 of the support 50 are removed by grinding, which is called chamfering or beveling. The reasons why chamfering or beveling is necessary are as follows. When a glass plate is cut using, for example, a glass cutter, the edges of the surface cut are sharp, and, therefore, it is possible that glass chips will be produced when the edges are touched during handling and precise dimensions cannot be obtained when a glass plate is cut using a glass cutter.

The width of the portion 51 removed by chamfering or beveling is about 0.1 to about 0.5 mm, and the angle between the surface 51 and the surface of the support is around 45°, therefore, when a silver halide emulsion is coated on the support by spin coating, a uniform thickness area 53 and a thick area 54 at the periphery arise as shown in FIG. 5. Therefore, the support of the present invention tapered in sufficiently large width at the periphery is completely different from a conventional so-called chamfered or beveled support.

Figure 6:
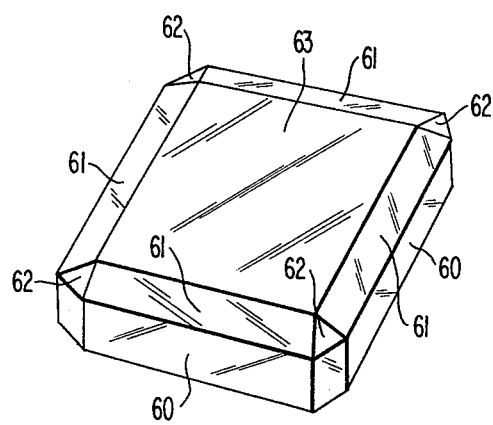
FIG. 6 illustrates a still another embodiment of a support of the present invention.

FIG. 6 illustrates one embodiment of the support of the present invention which is a square plate. When a silver halide emulsion is coated on a square plate by spin coating, the thickness of the coated layer is apt to become largest at the four corners, and, accordingly, it is advantageous to remove the corner portions. In FIG. 6, numeral 60 designates a support, 61 designates an area ground in tapered fashion at the periphery in addition to the four corners, and 62 designates an area additionally ground at the corners. Numeral 63 designates a flat area which occupies the major portion of the support. All earlier disclosure regarding earlier embodiments of the present invention apply with equal force to this embodiment, i.e., the disclosure regarding the periphery, preferred degrees of flatness, etc. It is to be specifically noted, in this regard, that the angle formed by the areas 61 and 62 is not overly important.

Figure 7:
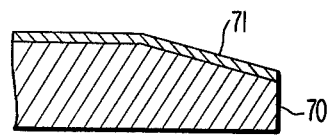
FIGS. 7 and 8 illustrate embodiments of a support having a mask layer of the present invention.

FIG. 7 illustrates a photomask blank which has a mask layer 71 formed on a transparent support 70 such as shown in FIG. 3 or FIG. 6.

As the mask layer, any of those known in the art can be used. Examples of the mask layer include metals such as chromium, nickel, cobalt, titanium, a nickel-chromium alloy, a nickel-iron alloy, an iron-chromium alloy, an iron-aluminum alloy, etc., semi-metals such a germanium, silicon, etc., metal oxides such as chromium oxide, iron oxide, copper oxide, cobalt oxide, silicon oxide, etc., and mixtures thereof such as $Cr_2O_3$ on Cr, $SiO_2$ on Si, etc. A suitable thickness of the mask layer ranges from 0.05 to about 3 microns.

A transparent support is a support which comprises a substance capable of transmitting not less than 50%, preferably not less than 70%, of electromagnetic waves in the near ultraviolet region and the visible light region.

As the transparent support, glass, silica, sapphire, quartz, plastic, etc., can be used.

Figure 8:
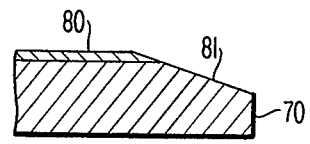

The mask layer can be formed on the support of the present invention, or the mask layer can be formed on a conventional support followed by grinding the periphery to remove the mask layer and the support in a tapered fashion at the ground portion 81 as shown in FIG. 8. In FIG. 8, numeral 80 designates a mask layer.

For grinding of the periphery of the support, conventional grinding technique for glass known in the art can be utilized. Also, the periphery of the support can be chemically dissolved away, if desired. For example, the edge of the glass support can be removed by dissolving with hydrofluoric acid. Typically, about 2 to about 6 mm from the edge of the support can be ground away or chemically dissolved away, as earlier disclosed.

Figure 9:
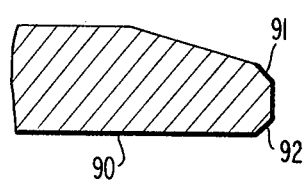
FIG. 9 illustrates an enlarged sectional view of the periphery of one embodiment of the support of the present invention having chamfered edges (or beveled edges).

Edges of the support of the present invention may be removed by chamfering or beveling in the same manner as a conventional support as shown in FIG. 9 (as designated by numerals 91 and 92).

Figure 10:
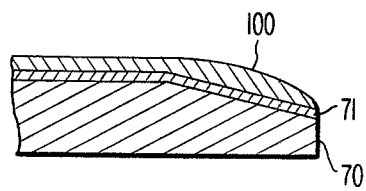
FIG. 10 illustrates an enlarged sectional view of the periphery of one embodiment of the light-sensitive photomask material which comprises a silver halide emulsion layer on a support having a mask layer of the present invention.

FIG. 10 illustrates an enlarged sectional view of the periphery of a light-sensitive photomask material obtained by forming a silver halide emulsion layer 100 on a mask blank as shown in FIG. 7. A mask layer is a material layer which at least provides a masking effect to ultraviolet light, and, more preferably, is a layer of a material which transmits visible light and absorbs ultraviolet light. The photomask material having such as structure can be converted to a photomask using a method as described in, for example, Japanese patent application (Laid Open) No. 70,007/75.

The silver halide emulsion used for the present invention includes all known silver halide photographic emulsions and is obtained by dispersing a silver halide such as silver chloride, silver bromide, silver iodide, silver chlorobromide, silver bromoiodide, silver bromochloroiodide, etc., into a hydrophilic polymer such as gelatin, casein, albumin, etc. While not to be construed as limitative, usually emulsions as are applied by spin coating in accordance with the present invention have a solids content of about 1 to about 40% by weight.

Commercially available conventional emulsion masks have been obtained by coating a silver halide emulsion on a square glass plate having a large size (e.g., 10 to 20 inches (25 to 50 mm) square) and cutting the same into small sizes (e.g., 2 to 4 inches (5 to 10 cm) square). Therefore, the flatness of the masks has been bad since the glass support has not been optically polished. In addition, the masks have the disadvantage that glass chips are formed during handling since the edges of the cut surface are sharp. However, the photographic material of the present invention as shown in FIG. 3 (b) or FIG. 4 can prevent these disadvantages, and provides emulsion masks of high quality.

With the support or the mask blank of the present invention, a silver halide emulsion layer having no raised portions at the periphery can be obtained by spin coating with a relatively low spin speed such as 100 to 200 r.p.m.

The light-sensitive material of FIG. 10 can be used for use (e.g., heat resistant, durable use) other than photomasks.

Having thus generally described the invention, the following examples illustrate currently preferred embodiments of practicing the invention.

EXAMPLE 1

The periphery of one surface of a square glass plate of 2.5 × 2.5 inch (6.4 × 6.4 cm) and a thickness of 1.6 mm was removed by grinding in tapered fashion as shown in FIG. 3. The width of the area removed in tapered fashion was about 3 mm, and the angle between the tapered surface and the upper surface of the support was about 8°. On the thus obtained support of the present invention a gelatin subbing layer was coated in a dry thickness of about 0.3 micron by spin coating at conditions of 800 r.p.m. and 30 seconds.

Then, a silver halide emulsion prepared as described in the following was coated by spin coating on the subbing layer.

1,100 ml of a silver bromide emulsion (mean grain size of silver bromide: about 0.06 micron) was prepared using 50 g of gelatin and 188 g of silver bromide. This emulsion was subjected to physical ripening in a conventional manner, and subjected to chemical ripening in a conventional manner using sodium thiosulfate and chloroauric acid. To this emulsion was added 0.15 g of 5-[2-(3-methylthiazolinylidene)ethylidene]-3-carboxymethyl rhodanine to optically sensitize the emulsion to light of a wavelength of 510 to 560 nm.

The spin speed of the spin coating was 150 r.p.m. After revolution for about 30 seconds, the light-sensitive photographic material was subjected to natural drying to obtain an emulsion layer having a dry thickness of about 3.5 microns.

The surface of the uniform coated layer at the center portion was raised as compared to the surface of the thick coated layer at the periphery, and, accordingly, the objects of the present invention were satisfied.

In addition, the same silver halide emulsion was coated on a conventional support not having a tapered portion at the periphery at the same conditions as above. The thickness of the raised portion at the periphery was about 40 microns.

EXAMPLE 2

Onto the glass support of Example 1 was formed a chromium layer at a thickness of about 800 A by vacuum deposition, and on the chromium layer was coated a silver halide emulsion (the silver halide emulsion was obtained by diluting the emulsion of Example 1 (300 ml of water was added to 1,100 ml of the emulsion of Example 1)) at a spin speed of 140 r.p.m. for 30 seconds in the same manner as described in Example 1 to obtain a light-sensitive photomask material having a dry coated layer of about 2.4 microns.

The thus obtained photomask material was processed using the method as described in Japanese patent application (Laid Open) No. 70,007/75 to obtain a photomask having a good chromium pattern.

In addition, the support or the mask blank of the present invention is particularly suitable for spin coating of a silver halide emulsion, however, it is effective for spin coating of other coating solutions where the same problems occur. For example, a photoresist coating solution such as polyvinyl cinnamate in xylene, a quinone diazide and a novolak resin in acetone, etc.

While the invention has been described in detail and with reference to specific embodiments thereof, it will be apparent to one skilled in the art that various changes and modifications can be made therein without departing from the spirit and scope thereof.

What is claimed is:

1. A light-sensitive photomask material comprising a silver halide emulsion layer having central and peripheral portions spin coated on a mask layer formed on the surface of a support suitable for spin coating, said support being transparent to near ulraviolet and visible light and formed of a member selected from the group consisting of glass, silica, sapphire and quartz, said surface being flat except at the periphery where said surface is removed in an amount of at least the excess thickness at the periphery of the spin coated silver halide emulsion layer, such that the surface of said spin coated silver halide emulsion layer at the periphery is not raised in comparison to the surface of said spin coated silver halide emulsion layer at the center.

2. The light-sensitive photomask of claim 1 wherein said mask layer has a thickness of from 0.05 to about 3 microns.

3. The light-sensitive photomask of claim 2 wherein said support is glass.

4. The light-sensitive photomask of claim 1 wherein the surface of the support is removed in an amount of 2 to about 6 millimeters.

5. The light-sensitive photomask material of claim 1, wherein said mask layer is a layer of a metal, a metal oxide, a semi-metal, or a mixture thereof.

6. The light-sensitive photomask material of claim 5, wherein said metal is chromium, nickel, cobalt, titanium, a nickel-chromium alloy, a nickel-iron alloy, an iron-chromium alloy or an iron-aluminum alloy; said metal oxide is chromium oxide, iron oxide, copper oxide, cobalt oxide or silicon oxide; said semi-metal is germanium or silicon; and said mixture is $Cr_2O_3$ on Cr or $SiO_2$ on Si.

7. A light-sensitive photographic material which comprises a silver halide emulsion layer having central and peripheral portions spin coated on the surface of a support suitable for spin coating, said support being transparent to near ultraviolet and visible light and formed of a member selected from the group consisting of glass, silica, sapphire and quartz, said surface being flat except at the periphery where said surface is removed in an amount of at least the excess thickness at the periphery of said spin coated silver halide emulsion layer, such that the surface of said spin coated silver halide emulsion layer at the periphery is not raised in comparison to the surface of the spin coated silver halide emulsion layer at the center.

8. The light-sensitive photographic material of claim 7 wherein said support is glass.

9. The light-sensitive photographic material of claim 7 wherein the surface of said support is removed in an amount of 2 to about 6 millimeters.

* * * * *